United States Patent
Lee et al.

(10) Patent No.: US 11,329,117 B2
(45) Date of Patent: May 10, 2022

(54) THIN FILM TRANSISTOR, DISPLAY APPARATUS INCLUDING THE SAME, AND MANUFACTURING METHODS THEREOF

(71) Applicant: SAMSUNG DISPLAY CO., LTD., Yongin-si (KR)

(72) Inventors: Dongsung Lee, Yongin-si (KR); Jihwan Kim, Yongin-si (KR); Jongoh Seo, Yongin-si (KR); Byungsoo So, Yongin-si (KR); Dongmin Lee, Yongin-si (KR); Yeonhee Jeon, Yongin-si (KR); Jonghoon Choi, Yongin-si (KR); Byungkyu Son, Yongin-si (KR); Seunghyun Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/877,735

(22) Filed: May 19, 2020

(65) Prior Publication Data

US 2021/0013281 A1 Jan. 14, 2021

(30) Foreign Application Priority Data

Jul. 12, 2019 (KR) ........................ 10-2019-0084545

(51) Int. Cl.
| | | |
|---|---|---|
| *H01L 27/32* | (2006.01) | |
| *H01L 51/56* | (2006.01) | |
| *H01L 27/12* | (2006.01) | |
| *H01L 29/786* | (2006.01) | |
| *H01L 21/02* | (2006.01) | |
| *H01L 29/66* | (2006.01) | |

(52) U.S. Cl.
CPC .... *H01L 27/3262* (2013.01); *H01L 21/02488* (2013.01); *H01L 21/02532* (2013.01); *H01L 21/02592* (2013.01); *H01L 21/02661* (2013.01); *H01L 21/02686* (2013.01); *H01L 27/1222* (2013.01); *H01L 27/1274* (2013.01); *H01L 29/66757* (2013.01); *H01L 29/78675* (2013.01); *H01L 51/56* (2013.01); *H01L 2227/323* (2013.01)

(58) Field of Classification Search
CPC .......... H01L 27/3262; H01L 21/02488; H01L 21/02532
See application file for complete search history.

(56) References Cited

U.S. PATENT DOCUMENTS

| | | |
|---|---|---|
| 6,071,765 A | 6/2000 | Noguchi et al. |
| 8,404,408 B2 | 3/2013 | Lee et al. |
| 9,257,290 B2 | 2/2016 | Xu |

(Continued)

FOREIGN PATENT DOCUMENTS

| | | |
|---|---|---|
| KR | 100299292 B1 | 12/2001 |
| KR | 100874457 B1 | 12/2008 |

(Continued)

*Primary Examiner* — Douglas M Menz
(74) *Attorney, Agent, or Firm* — Cantor Colburn LLP

(57) ABSTRACT

A method of manufacturing a thin film transistor includes: removing an oxide film on a surface of an amorphous silicon layer by performing a surface cleaning; and forming an active layer by performing a heat treatment on the amorphous silicon layer, where the amorphous silicon layer is changed into crystalline silicon by the heat treatment.

16 Claims, 14 Drawing Sheets

(56) References Cited

U.S. PATENT DOCUMENTS

| | | | | |
|---|---|---|---|---|
| 2002/0034845 | A1* | 3/2002 | Fujimura | H01L 21/02691 438/166 |
| 2004/0127032 | A1* | 7/2004 | Peng | H01L 21/02052 438/689 |
| 2006/0240647 | A1* | 10/2006 | Mitsuhashi | H01L 21/67253 438/487 |
| 2011/0300674 | A1* | 12/2011 | Chung | H01L 21/02532 438/151 |

FOREIGN PATENT DOCUMENTS

| | | |
|---|---|---|
| KR | 1020110102685 A | 9/2011 |
| KR | 101872629 B1 | 8/2018 |

* cited by examiner

THIN FILM TRANSISTOR, DISPLAY APPARATUS INCLUDING THE SAME, AND MANUFACTURING METHODS THEREOF

This application claims priority to Korean Patent Application No. 10-2019-0084545, filed on Jul. 12, 2019, and all the benefits accruing therefrom under 35 U.S.C. § 119, the content of which in its entirety is herein incorporated by reference.

BACKGROUND

1. Field

One or more embodiments relate to a thin film transistor, which is used in a display apparatus, etc., and more particularly, relate to a thin film transistor including an active layer having an improved structure for manufacturing, a display apparatus including the thin film transistor, and manufacturing methods of the thin film transistor and the display apparatus.

2. Description of the Related Art

Generally, a display apparatus such as an organic light-emitting display apparatus includes a thin film transistor for driving each pixel, and the thin film transistor includes an active layer. The active layer is typically formed in an amorphous state on a substrate and then is crystallized through proper heat treatment.

SUMMARY

In a crystallization process for an active layer, a protrusion may be formed to protrude above a surface at a boundary between crystal grains. That is, as amorphous silicon turns crystalline during heat treatment, crystal grains collide while growing and form a boundary, and such a protrusion may be formed to be above a surface at a grain boundary where the collision occurs.

However, when the protrusion becomes too large, an electric field is concentrated on a tip thereof, and thus, deviations in electrical characteristics of a device may increase, thereby causing undesired instability. Further, the protrusion may be perceived by the user as a pattern such as a Moiré pattern as if there were undesired spots on the screen. As a result, the reliability of the product may be decreased.

Specifically, an oxide film on a surface of an amorphous active layer before crystallization has been noted as a main element that increases a size of the protrusion.

Accordingly, one or more embodiments include a thin film transistor improved to solve, by decreasing a size of a protrusion formed at a grain boundary of an active layer, excessive concentration of an electric field on the protrusion and screen quality failure due to visibility of a spotted pattern, a display apparatus including the thin film transistor, and manufacturing methods of the thin film transistor and the display apparatus.

According to an embodiment, a method of manufacturing a thin film transistor includes providing an amorphous silicon layer over a substrate, removing an oxide film on a surface of the amorphous silicon layer by performing a surface cleaning, and forming an active layer by performing a heat treatment on the amorphous silicon layer, where the amorphous silicon layer is changed into crystalline silicon by the heat treatment.

In an embodiment, the removing the oxide film on the surface of the amorphous silicon layer by performing the surface cleaning may include removing the oxide film by spraying a hydrogen fluoride solution onto the surface of the amorphous silicon layer.

In an embodiment, the hydrogen fluoride solution may include about 0.5 volume percent (vol %) of hydrogen fluoride.

In an embodiment, the removing the oxide film on the surface of the amorphous silicon layer by performing the surface cleaning may further include performing a first rinse cleaning including supplying hydrogen water to the surface of the amorphous silicon layer in a free fall manner.

In an embodiment, the removing the oxide film on the surface of the amorphous silicon layer by performing the surface cleaning may further include performing a second rinse cleaning including supplying hydrogen water to the surface of the amorphous silicon layer in a free fall manner while applying vibration to the hydrogen water with megasonic waves.

In an embodiment, the forming the active layer may include radiating a laser beam onto the amorphous silicon layer arranged over the substrate, where the laser beam may have long sides and short sides in a first direction and a second direction perpendicular to each other, respectively, and moving the substrate by a predetermined pitch in the second direction parallel to the short sides.

In an embodiment, the laser beam may be repeatedly turned on and off whenever the substrate is moved by the predetermined pitch, where the predetermined pitch may be set to allow the laser beam to be turned on at least 7 times in a unit region of the amorphous silicon layer.

In an embodiment, the method may further include providing a buffer layer between the substrate and the amorphous silicon layer, wherein a thickness of the amorphous silicon layer may be in a range of about 370 angstrom (Å) to about 430 Å, and the buffer layer may include SiOx in a thickness of about 4000 Å to about 5000 Å.

According to an embodiment, a thin film transistor includes a substrate, an active layer over the substrate, a gate electrode facing the active layer, a source electrode connected to the active layer and a drain electrode connected to the active layer, where a surface of the active layer includes a protrusion, and a height of the protrusion is about 3 nanometers (nm) or less.

In an embodiment, the thin film transistor may further include a buffer layer between the substrate and the active layer, where a thickness of the amorphous silicon layer may be about 370 Å to about 430 Å, wherein the buffer layer may include SiOx in a thickness of about 4000 Å to about 5000 Å.

According to an embodiment, a method of manufacturing a display apparatus includes providing a thin film transistor over a substrate, and providing an organic light-emitting device connected to the thin film transistor, where the providing the thin film transistor includes providing an amorphous silicon layer over the substrate, removing an oxide film on a surface of the amorphous silicon layer by performing a surface cleaning, and forming an active layer by performing a heat treatment on the amorphous silicon layer, where the amorphous silicon layer is changed into crystalline silicon by the heat treatment.

In an embodiment, the removing the oxide film on the surface of the amorphous silicon layer by performing the surface cleaning may include spraying a hydrogen fluoride solution onto the surface of the amorphous silicon layer.

In an embodiment, the hydrogen fluoride solution may include about 0.5 vol % of hydrogen fluoride.

In an embodiment, the removing the oxide film on the surface of the amorphous silicon layer by performing the surface cleaning may further include performing a first rinse cleaning including supplying hydrogen water to the surface of the amorphous silicon layer in a free fall manner.

In an embodiment, the removing the oxide film on the surface of the amorphous silicon layer by performing the surface cleaning may further include performing a second rinse cleaning including supplying hydrogen water to the surface of the amorphous silicon layer in a free fall manner while applying vibration to the hydrogen water with megasonic waves.

In an embodiment, the forming the active layer may include radiating a laser beam onto the amorphous silicon layer arranged over the substrate, where the laser beam may have long sides and short sides in a first direction and a second direction perpendicular to each other, respectively, and moving the substrate by a predetermined pitch in the second direction parallel to the short sides.

In an embodiment, the laser beam may be repeatedly turned on and off whenever the substrate is moved by the predetermined pitch, wherein the predetermined pitch may be set to allow the laser beam to be turned on at least 7 times in a unit region of the amorphous silicon layer.

In an embodiment, the method may further include providing a buffer layer between the substrate and the amorphous silicon layer, wherein a thickness of the amorphous silicon layer may be in a range of about 370 Å to about 430 Å, where the buffer layer may include SiOx in a thickness of 4000 Å to about 5000 Å.

According to an embodiment, a display apparatus includes a thin film transistor over a substrate and an organic light-emitting device connected to the thin film transistor, where the thin film transistor includes an active layer over the substrate, a gate electrode facing the active layer, a source electrode connected to the active layer and a drain electrode connected to the active layer, where a surface of the active layer includes a protrusion, and a height of the protrusion is about 3 nm or less.

In an embodiment, the display apparatus may further include a buffer layer between the substrate and the active layer, where a thickness of the amorphous silicon layer may be in a range of 370 Å to about 430 Å, and the buffer layer may include SiOx in a thickness of about 4000 Å to about 5000 Å.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1:
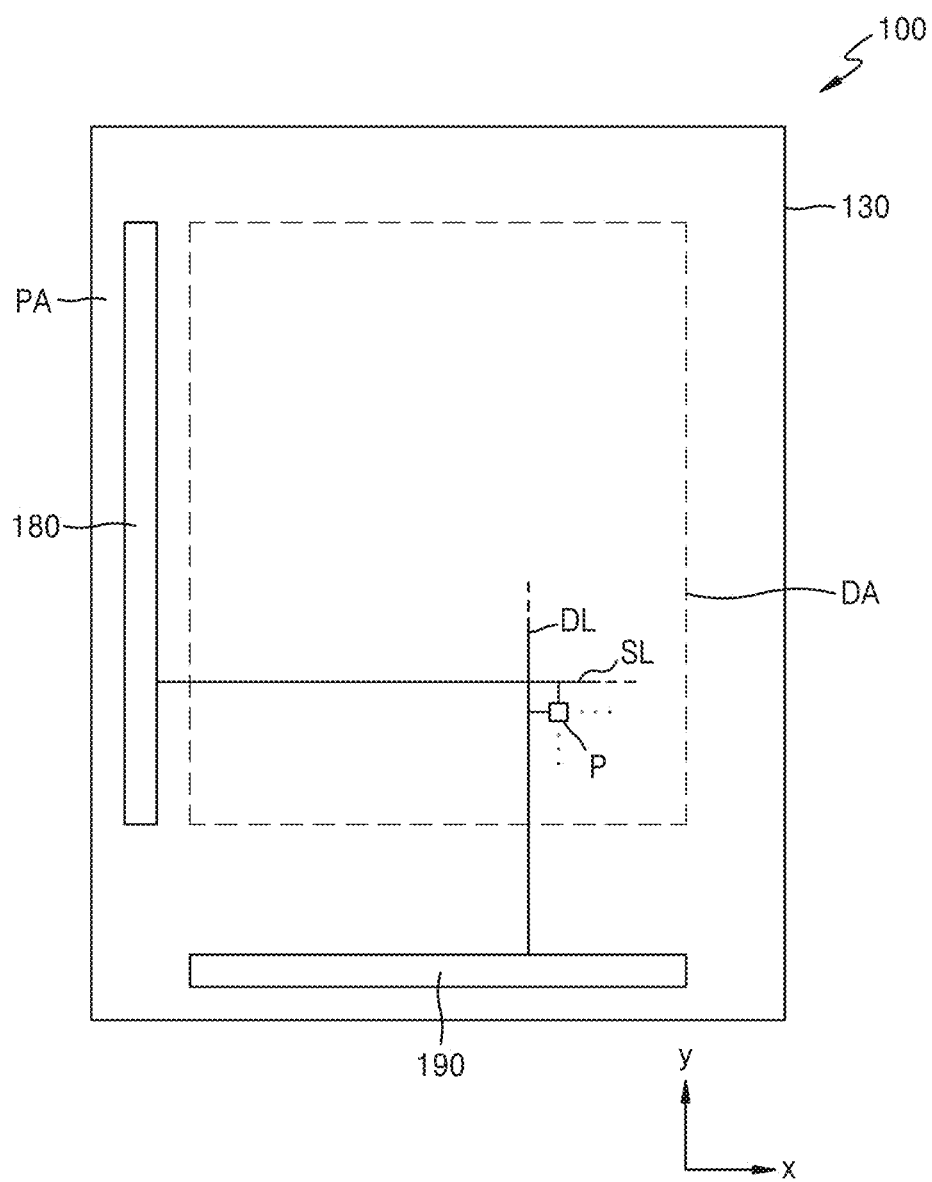
FIG. 1 is a plan view of a display apparatus including a thin film transistor, according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be further understood that, when a layer, region, or component is referred to as being "on" another layer, region, or component, it can be directly or indirectly on the other layer, region, or component. That is, for example, intervening layers, regions, or components may be present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Sizes of components in the drawings may be exaggerated or reduced for convenience of explanation. In other words, since sizes and thicknesses of components in the drawings are arbitrarily illustrated for convenience of explanation, the present description is not limited thereto.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When an embodiment may be implemented differently, a certain process order may be performed differently from the described order. For example, two consecutively described processes may be performed substantially at the same time or performed in an order opposite to the described order.

Hereinafter, embodiments of the invention will be described in detail with reference to the accompanying drawings.

Figure 2:
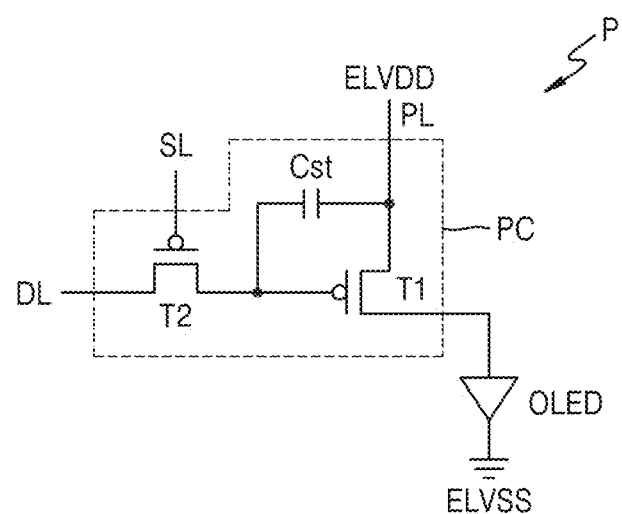
FIG. 2 is an equivalent circuit diagram of a pixel of the display apparatus shown in FIG. 1.

FIG. 1 is a schematic plan view of a display apparatus 100 according to an embodiment, and FIG. 2 is an equivalent circuit diagram of a pixel P of the display apparatus 100 shown in FIG. 1.

Referring to FIG. 1, an embodiment of the display apparatus 100 may include a display area DA and a peripheral area PA over a substrate 130.

A plurality of pixels P is arranged in the display area DA on the substrate 130. In an exemplary embodiment, as shown in FIG. 2, each pixel P may include a pixel circuit PC and an organic light-emitting device OLED, which is a display element connected to the pixel circuit PC. The pixel circuit PC may include a first thin film transistor T1, a second thin film transistor T2, and a storage capacitor Cst. Each pixel P may emit, for example, red, green or blue light, or may emit red, green, blue or white light through the organic light-emitting device OLED.

The second thin film transistor T2, which is a switching thin film transistor, may be connected to a scan line SL and a data line DL and may provide a data voltage input from the data line DL to the first thin film transistor T1 based on a switching voltage input from the scan line SL. Herein, the scan line SL may extend in a first direction x, and the data line DL may extend in a second direction y crossing the first direction x. A third direction z (shown in FIG. 3) may be a direction perpendicular to the first and second directions X and Y, or a thickness direction of the substrate 130. The storage capacitor Cst may be connected to the second thin film transistor T2 and a driving voltage line PL and may store a voltage corresponding to a difference between a voltage received from the second thin film transistor T2 and a first power voltage ELVDD, which is supplied to the driving voltage line PL.

The first thin film transistor T1, which is a driving thin film transistor, may be connected to the driving voltage line PL and the storage capacitor Cst and may control a driving current flowing from the driving voltage line PL to the organic light-emitting device OLED in response to a voltage value stored in the storage capacitor Cst. The organic light-emitting device OLED may emit light having a brightness corresponding to the driving current. An electrode (e.g. a cathode) of the organic light-emitting device OLED may be supplied with a second power voltage ELVSS.

In an embodiment, as shown in FIG. 2, the pixel circuit PC may include two thin film transistors and a single storage capacitor, but embodiments are not limited thereto. The number of the thin film transistors and the number of the storage capacitors in each pixel circuit PC may be variously modified according to design of the pixel circuit PC. In one embodiment, for example, the pixel circuit PC may further include one or more thin film transistors in addition to the two thin film transistors described above.

Referring back to FIG. 1, a scan driver 180 for providing a scan signal to each pixel P, a data driver 190 for providing a data signal to each pixel P, and the like may be arranged in the peripheral area PA on the substrate 130. FIG. 1 shows an embodiment where the data driver 190 is adjacent to a lateral side of the substrate 130. In an alternative embodiment, the data driver 190 may be arranged on a flexible printed circuit board ("FPCB") electrically connected to a pad arranged on a side of the substrate 130.

A cross-sectional structure of an embodiment of the display apparatus 100 including a thin film transistor 110 will now be described with reference to FIG. 3.

Figure 3:
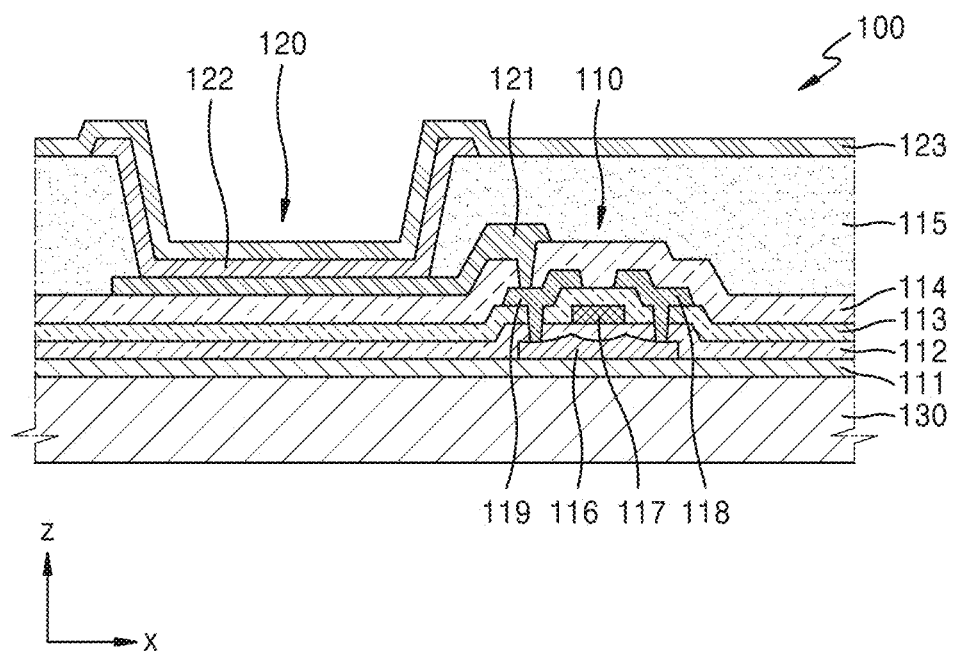
FIG. 3 is a cross-sectional view of a pixel of the display apparatus shown in FIG. 1.

FIG. 3 is a cross-sectional view of a pixel of the display apparatus shown in FIG. 1.

Both of the first and second thin film transistors T1 and T2 described above with reference to FIG. 2 may have a structure corresponding to the thin film transistor 110 shown in FIG. 3, but the thin film transistor 110 may be understood here as an embodiment of the first thin film transistor T1, which is a driving thin film transistor of the organic light-emitting device OLED.

In an embodiment, as shown in FIG. 3, the display apparatus 100 includes the thin film transistor 110 and an organic light-emitting device 120.

The organic light-emitting device 120, which is driven by the thin film transistor 110 to display an image by emitting light, includes a pixel electrode 121 and an opposite electrode 123 opposite to each other, and an emission layer 122 therebetween.

A predetermined voltage is applied to the opposite electrode 123 constantly, and a voltage is selectively applied to the pixel electrode 121 connected to the thin film transistor 110 via the thin film transistor 110. Accordingly, when a proper voltage difference is formed between the two electrodes, that is, the pixel electrode 121 and the opposite electrode 123, based on selective voltage application of the thin film transistor 110, the emission layer 122 therebetween displays an image by emitting light.

In an embodiment, the thin film transistor 110 has a structure in which an active layer 116, a gate electrode 117, a source electrode 118 and a drain electrode 119 are sequentially stacked one on another over the substrate 130. Accordingly, when an electric signal is applied to the gate electrode 117, a current is allowed to be applied from the source electrode 118 to the drain electrode 119 through the active layer 116, and thus, a voltage is applied to the pixel electrode 121 connected to the drain electrode 119, which leads to the above emission of the emission layer 122.

In FIG. 3, reference numeral 111 denotes a buffer layer between the substrate 130 and the active layer 116, reference numerals 112, 113, 114, and 115 denote a gate insulating layer, an interlayer insulating layer, a passivation film, and a pixel-defining film, respectively.

In an embodiment, a hole injection layer ("HIL"), a hole transport layer ("HTL"), an electron transport layer ("ETL"), an electron injection layer ("EIL"), etc. may be further stacked to be adjacent to the emission layer 122 in the organic light-emitting device 120. In an embodiment, the emission layer 122 may be separated for each pixel to allow pixels that emit red light, green light, and blue light to collectively constitute a unit pixel. Alternatively, the emission layer 122 may be commonly provided for the entire pixel region regardless of the location of a pixel. In such an embodiment, in the emission layer 122, layers including luminescent materials for emitting, for example, red light, green light, and blue light, may be vertically stacked or be mixed. Any combination of other various colors, which is capable of emitting white light, may be employed. In an embodiment, a color converting layer for converting the emitted white light into a certain color or a color filter may be further included. In an embodiment, a thin film encapsulation layer (not shown) including an organic film and an inorganic film alternately stacked may be on the opposite electrode 123.

In an embodiment, when the active layer 116 is formed, processes of forming an amorphous silicon layer on the buffer layer 111 arranged on the substrate 130 and then changing the amorphous silicon layer into a crystalline silicon layer by crystallizing the amorphous silicon layer through heat treatment are performed, and during such heat treatment, crystalline grains collide with each other while growing, and thus, a protrusion 1 (refer to FIG. 4F) may be formed at a boundary thereof. When the protrusion 1 grows too high, an electric field is concentrated thereon, and thus, as described above, deviations in electrical characteristics of a device may increase, thereby causing undesired instability. Also, the protrusion 1 may be perceived by the user as a pattern such as a Moiré pattern as if there were undesired spots on the screen. Accordingly, in an embodiment of the invention, the following manufacturing processes may be performed for managing a height of the protrusion 1 (refer to FIG. 4F) of the active layer 116 to be a proper height to effectively prevent the above problem.

FIGS. 4A to 4H show an embodiment of manufacturing processes improved to control a height of the protrusion 1 of the active layer 116 to be equal to or less than a proper height as described above.

Figure 4A:
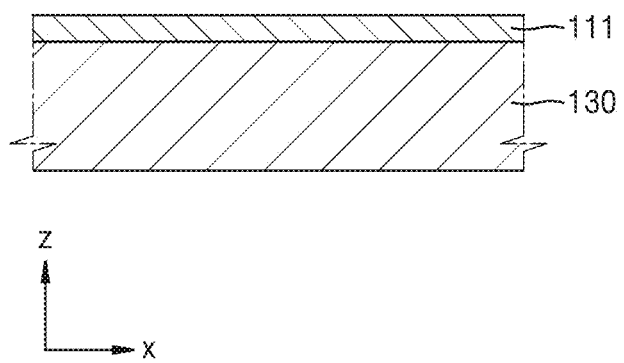
FIGS. 4A to 4H are cross-sectional views showing an embodiment of manufacturing processes of a thin film transistor shown in FIG. 3.

In an embodiment, as shown in FIG. 4A, the buffer layer 111 is provided or formed on the substrate 130. In such an embodiment, the buffer layer 111 includes SiOx and has a thickness in a range of about 4000 angstrom (Å) to about 5000 Å. Typically, SiNx is used to form the buffer layer 111, but SiNx contains much hydrogen, and accordingly, a large amount of hydrogen may penetrate into the active layer 116 during the following crystallization process, thereby causing a problem in the characteristics of the active layer 116. Accordingly, in an embodiment, SiOx having a low hydrogen content is used, and the buffer layer 111 is formed in a small thickness in the range of about 4000 Å to about 5000 Å.

Figure 4B:
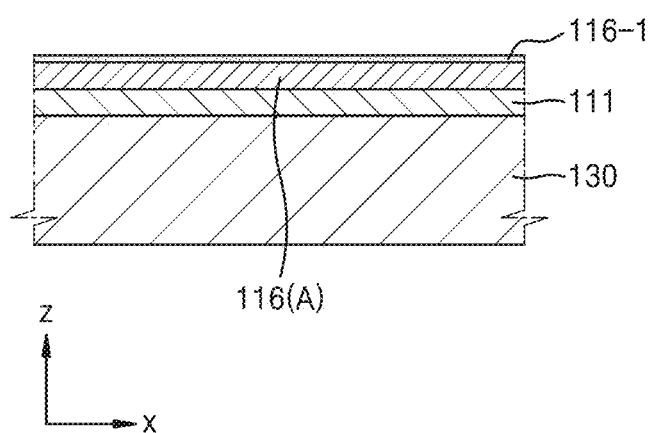

In an embodiment, as shown in FIG. 4B, an amorphous silicon layer 116(A), which will be formed as the active layer 116, is provided or formed on the buffer layer 111, and the amorphous silicon layer 116(A) is also thin enough to have a thickness in a range of about 370 Å to about 430 Å. In an embodiment, where the amorphous silicon layer 116 (A) is thick, e.g., thicker than the thickness in the above range, the protrusion 1 may become bigger later, and thus, the amorphous silicon layer 116(A) is basically formed in a small thickness.

In such an embodiment, as shown in FIG. 4B, an oxide film 116-1 is naturally formed on the amorphous silicon layer 116(A). Accordingly, the oxide film 116-1 is removed first before crystallization is performed. If the oxide film 116-1 is removed by a conventional water cleaning or ozone ($O_3$) cleaning, the oxide film 116-1 may not be completely removed, and a residue thereof may be left all over, such that the residue of the oxide film 116-1 may cause the protrusion 1 of the active layer 116 to be heightened after crystallization. The reason for this will be described later.

Figure 4C:
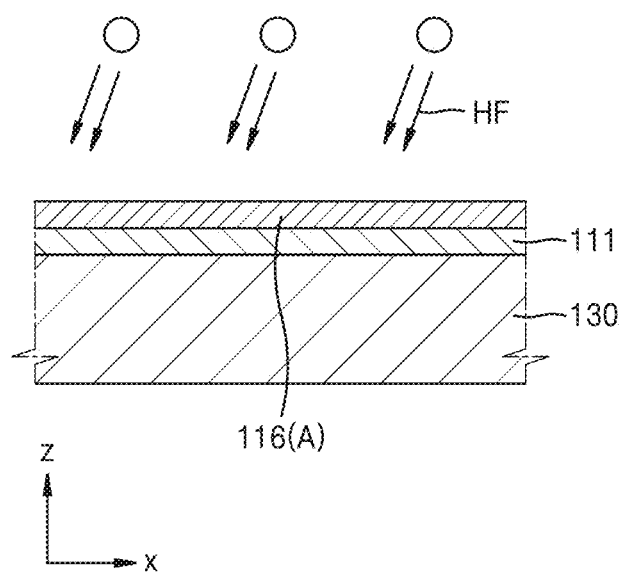

Accordingly, in an embodiment, as shown in FIG. 4C, a hydrogen fluoride solution containing about 0.5 volume percent (vol %) of hydrogen fluoride (HF) is sprayed onto the oxide film 116-1 for about 60 seconds to about 120 seconds to effectively completely remove the oxide film 116-1, and thus, the oxide film 116-1 is removed by a chemical reaction. When the hydrogen fluoride solution is sprayed as described above, the oxide film 116-1 may be effectively completely removed without leaving a residue.

Figure 4D:
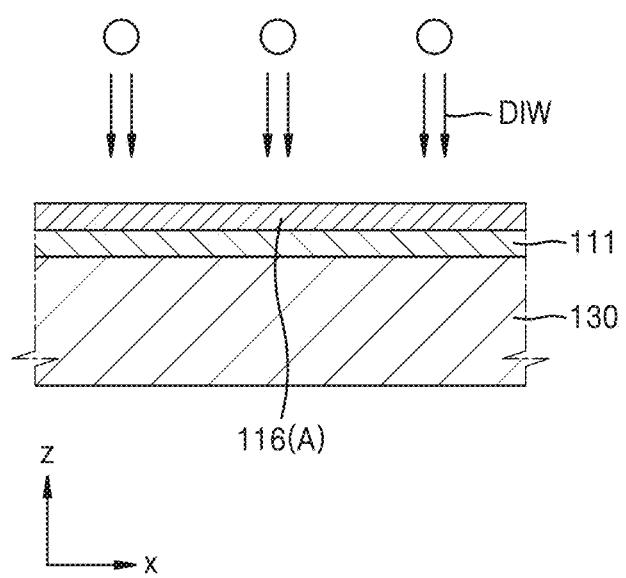

In an embodiment, as shown in FIG. 4D, with hydrogen water DIW containing about 1 part per million (ppm) of hydrogen, a first rinse cleaning is performed on a surface of the amorphous silicon layer 116(A) having the oxide film 116-1 removed. In such an embodiment, the hydrogen water DIW is not sprayed but is dropped in a free fall manner to flow over the surface of the amorphous silicon layer 116(A). The hydrogen water DIW is a liquid that contains about 1 ppm of hydrogen and has no oxygen, and accordingly, no oxide film is formed again on the surface of the amorphous silicon layer 116(A) in spite of cleaning using the hydrogen water DIW. However, when the hydrogen water DIW is sprayed, the surface area of liquid particles scattered in drops dramatically increases, and thus, the chance of oxygen being intermingled therewith increases. Accordingly, formation of a second oxide film may be caused. Accordingly, in an embodiment, the surface of the amorphous silicon layer 116(A) is rinse-cleaned by supplying the hydrogen water DIW in a free fall manner instead of spraying the hydrogen water DIW.

Figure 4E:
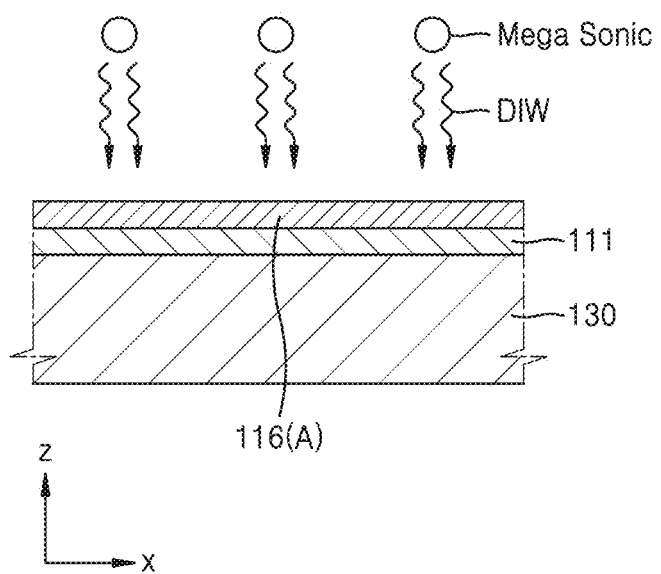

In an embodiment, as shown in FIG. 4E, a second rinse cleaning is performed. In such an embodiment, the second rinse cleaning is substantially the same as the first rinse cleaning including supplying the hydrogen water DIW containing 1 ppm of hydrogen in a free fall manner, except that the hydrogen water DIW is supplied by adding vibration to the hydrogen water DIW with megasonic waves. In such an embodiment, as liquid particles of the hydrogen water DIW vibrate, a rinsing effect may be further enhanced.

Figure 4F:
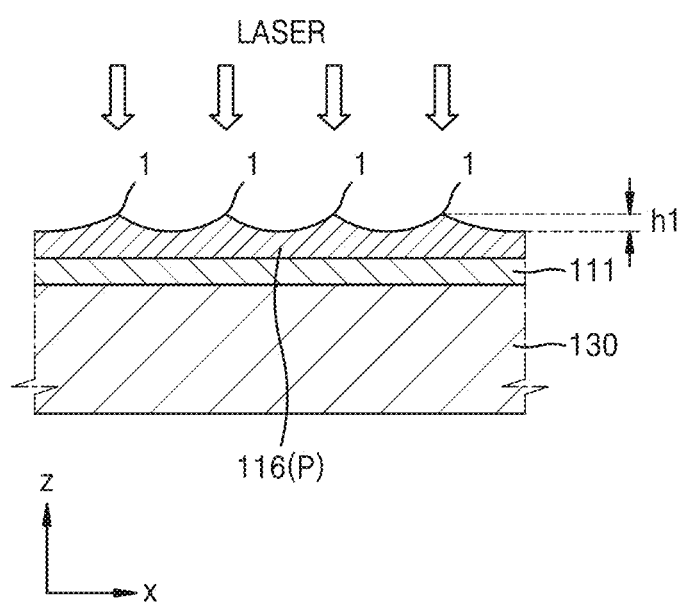
Figure 4G:
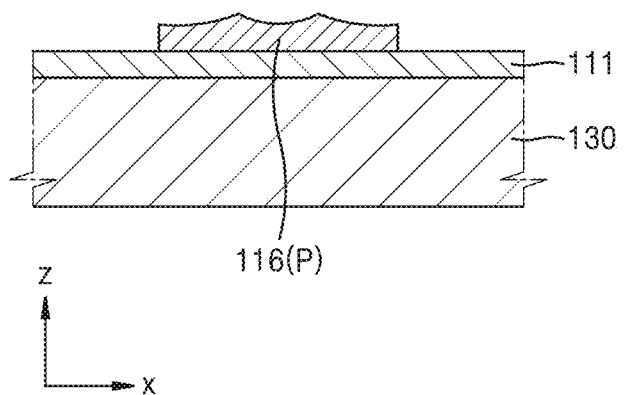

When the amorphous silicon layer 116(A) having the oxide film 116-1 completely removed without leaving a residue is prepared through the above processes, as shown in FIG. 4F, a heat treatment process for changing the amorphous silicon layer 116(A) into a crystalline silicon layer 116(P) by radiating a laser beam and heating the amorphous silicon layer 116(A) at a crystallization temperature or greater is performed. The laser beam may be, for example, an excimer laser beam.

In such an embodiment, as described above, as grains grow through melting and solidification processes and collide at grain boundaries, protrusions 1 are formed. In such an embodiment, because a residue of the oxide film 116-1 on the surface has been effectively completely removed, and thus, heat is uniformly transferred over the entire region, a height h1 of the protrusion 1 is effectively maintained at about 3 nanometers (nm) or less. Herein, the height h1 of the protrusion 1 is defined as a distance between an uppermost point and a lower most point of an upper surface the of crystalline silicon layer 116(P).

Hereinafter, an embodiment of the invention will be described with reference to a comparative example using a conventional heat treatment, where a residue of the oxide film 116-1 is left.

Figure 5A:
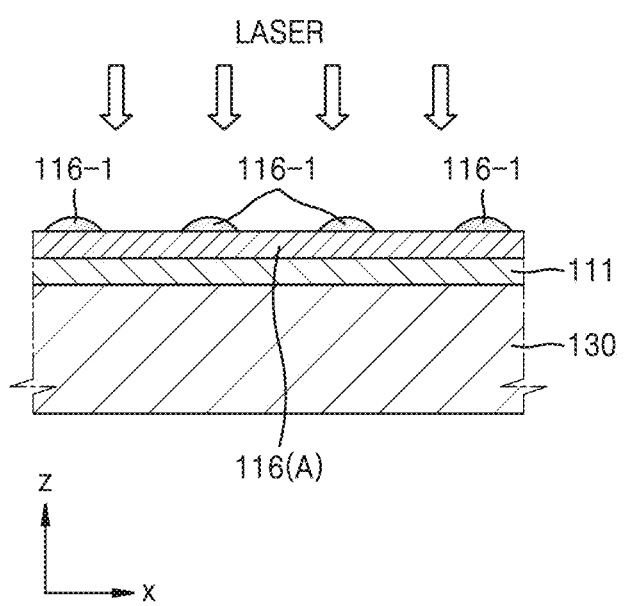
FIGS. 5A and 5B are cross-sectional views showing a conventional method in which an amorphous silicon layer is crystallized without removing an oxide film as a comparative example.
Figure 5B:
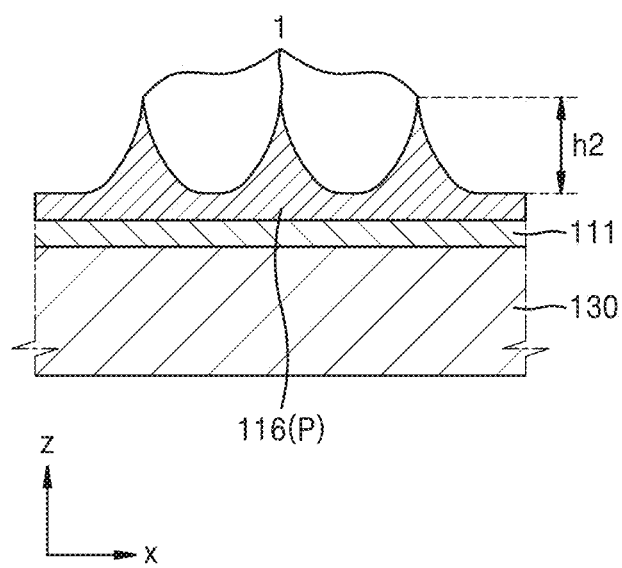

FIGS. 5A and 5B are cross-sectional views showing a conventional method in which an amorphous silicon layer is crystallized without removing an oxide film as a comparative example.

As shown in FIG. 5A, in a case where a removing operation by a hydrogen fluoride solution is not performed, and thus, residues of the oxide film 116-1 are left all over the surface of the amorphous silicon layer 116(A), regional deviations occur merely with heat transferred into the amorphous silicon layer 116(A) during radiation of a laser beam, and regional deviations occur merely with heat dissipated during solidification. That is, because heat does not flow smoothly in a region shaded by the residue of the oxide film 116-1, and flow of heat is relatively smooth in a region not shaded by the residue of the oxide film 116-1, crystallization proceeds faster in a place where heat flows smoothly, and thus, a height h2 of the protrusion 1 becomes relatively much greater. In such a case, when residues of the oxide film 116-1 are left, the height h2 of the protrusion 1 may be in a range of about 14 nm to about 16 nm. As a result, a problem may arise later in characteristics of the active layer 116 as a thin film transistor, and further, the projection 1 may be large enough to be perceived as spots by a user, which may degrade product quality.

In an embodiment of the invention, as described above, a crystallization heat treatment process is performed after the oxide film 116-1 is sufficiently removed with a hydrogen fluoride solution, such that the height h1 of the protrusion 1 may be controlled to be at about 3 nm or less, and thus, product quality may be improved.

A radiation process of the laser beam will be described in detail below with reference to FIG. 6.

After the crystallization heat treatment process described above is completed, as shown in FIG. 4G, the crystalline silicon layer 116(p) is patterned to have a size of the active layer 116 of the thin film transistor 110.

Figure 4H:
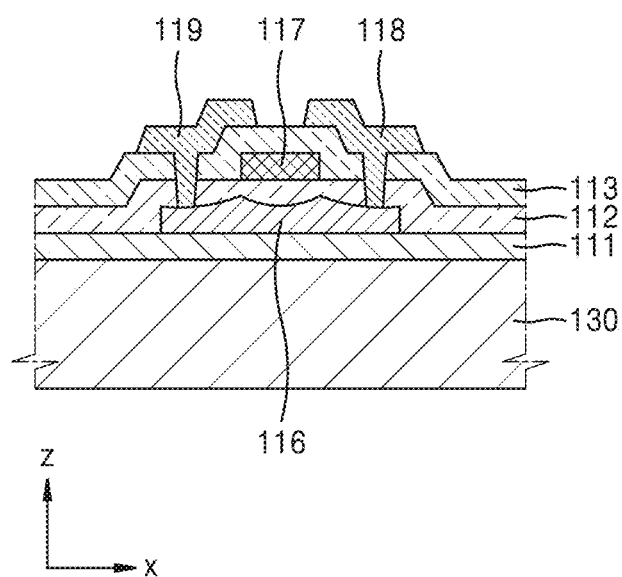

In an embodiment, as shown in FIG. 4H, the gate electrode 117 is formed to face the active layer 116 with the gate insulating layer 112 therebetween, and the interlayer insulating layer 113, the source electrode 118, and the drain electrode 119 are provided or formed.

Thus, the thin film transistor 110 with improved characteristics without undesired factors, such as concentration of an electric field on a certain region or a visible spotted pattern, is formed, and when the organic light-emitting device 120 is formed subsequentially, the display apparatus 100 shown in FIG. 3 is manufactured.

According to an experiment, the spotted pattern is decreased by about 20% compared to those manufactured by a conventional method so that the spotted pattern is substantially almost invisible to a naked eye, and deviations in electrical characteristics of regions of a thin film transistor are also improved by about 20% to about 45% to become highly uniform. Accordingly, when the thin film transistor 110 and the display apparatus 100 described above are implemented, quality thereof may be effectively stably obtained.

Figure 6:
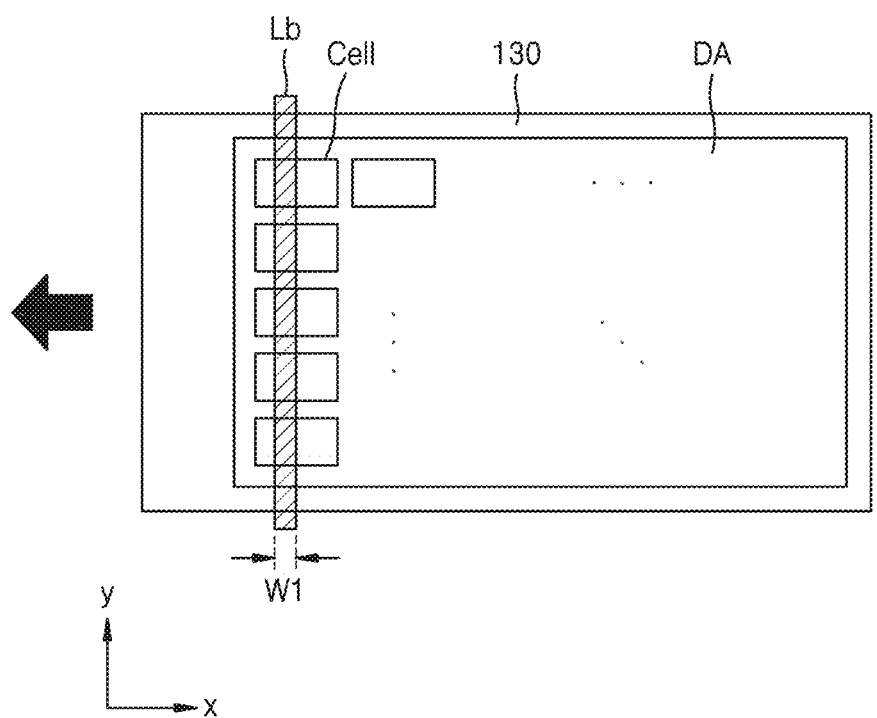
FIG. 6 is a plan view describing a laser beam radiation process illustrated in FIG. 4F in a planar direction.

When a laser beam is radiated to crystallize the amorphous silicon layer 116(A), a radiation method shown in FIG. 6 may be used.

A plurality of cells targeted for crystallization are lined up in the first and second directions X and Y over the substrate 130, and each cell may be understood as a region corresponding to a unit of the amorphous silicon layer 116(A) targeted for crystallization in the display area DA.

A laser beam Lb is radiated onto the cells arranged over the substrate 130 in the form of a rectangle having long sides in the second direction y of FIG. 6 and short sides in the first direction x of FIG. 6, and as the substrate 130 is moved by a predetermined pitch in the first direction x, the laser beam Lb is radiated onto the entire region of each cell. A short-side width W1 of the laser beam Lb is about 480 micrometers (μm), and the laser beam Lb is radiated at about 440 millijoule (mJ) to about 480 mJ of energy. The laser beam is not maintained in an on-state but is repeatedly on/off whenever the substrate 130 is moved by a certain pitch.

In an embodiment, the movement direction (X) of the substrate 130 and the long-side direction (Y) of the laser beam Lb are perpendicular to each other. In such an embodiment, the laser radiation work may be done so that the movement direction (X) of the substrate 130 and the long-side direction (Y) of the laser beam Lb are perpendicular to each other. In an embodiment of the invention, the movement direction (X) of the substrate 130 and the long-side direction (Y) of the laser beam Lb are allowed to be perpendicular to each other in the laser beam radiation process because the height of the protrusion 1 is about 3 nm or less.

When the protrusion 1 is high enough to reach about 15 nm in the related art, a height of the protrusion 1 itself may be sufficient to allow the user to perceive the protrusion 1 as spots, and when an effect resulting from energy deviations due to on/off of the laser beam Lb is added thereto, the spots may look bigger.

That is, when the laser beam Lb is turned on, a central region receives relatively more energy than an edge region, and when the laser beam Lb is turned on again after a certain pitch of movement, the central region receives relatively more energy than the edge region again, and thus, this deviation may cause a difference in degree of crystallization between the central region and the edge region and a stripe pattern extending long in the second direction y may repetitively appear in the first direction x. The stripe pattern itself may not be clearly visible to the user; however, when the stripe pattern combines with a spotted pattern due to a considerable height of the protrusion 1, the stripe pattern may cause the spotted pattern to be seen more clearly. Accordingly, in a conventional method, a long side of the laser beam Lb and a movement direction of the substrate 130 were allowed to form 89 degrees, which is inclined with respect to 90 degrees by 1 degree, to perform crystallization to resolve the above issues. Because the protrusions 1 are formed in the cells arranged in the directions X and Y, a stripe pattern due to radiation deviations of the laser beam Lb is slightly tilted not to be aligned with the directions X and Y. Thus, a spotted pattern due to a considerable height of the protrusion 1 and the stripe pattern due to radiation deviations of the laser beam Lb may not be accurately aligned.

However, when the laser beam Lb is tilted to prevent the long side of the laser beam Lb and the movement direction of the substrate 130 from being perpendicular to each other, the laser beam Lb moves diagonally above the substrate 130, and thus, dead space having no contact with the laser beam Lb increases in the substrate 130. That is, an area of the substrate 130 may not be effectively utilized.

In an embodiment of the invention, as described above, a height of the protrusion 1 may be controlled at about 3 nm or less, and thus, in spite of combination with a stripe pattern due to deviations of the laser beam Lb, the protrusion 1 may not be visible to the user. Accordingly, as shown in FIG. 6, a laser radiation work may be done so that the movement direction (X) of the substrate 130 and the long-side direction (Y) of the laser beam Lb are perpendicular to each other.

The stripe pattern due to deviations of the laser beam Lb may also be reduced, and to this end, a movement pitch may be set to turn on the laser beam Lb at least 7 times for one cell. The laser beam Lb being turned on is usually called a shot, and a movement pitch of the substrate 130 is set to make 7 or more tight shots in one cell. In one embodiment, for example, when the movement pitch is set to be in a range of about 1 μm to about 68 μm to use the laser beam Lb having short sides of about 480 μm, at least 7 shots may be generally made in one cell, and accordingly, the stripe pattern due to energy deviations of the laser beam Lb may also be reduced.

Accordingly, when embodiments of the thin film transistor, a display apparatus including the thin film transistor, and a manufacturing method of the thin film transistor and the display apparatus are used, excessive concentration of an electric field on the protrusion and screen quality failure due to visibility of a spotted pattern may be solved by decreasing a size of a protrusion formed at a grain boundary of an active layer, and thus, quality and reliability of the product may be obtained.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a thin film transistor, the method comprising:
   providing an amorphous silicon layer over a substrate;
   removing an oxide film on a surface of the amorphous silicon layer by performing a surface cleaning without an oxidant solution; and
   forming an active layer by performing a heat treatment on the amorphous silicon layer, wherein the amorphous silicon layer is changed into crystalline silicon by the heat treatment.

2. The method of claim 1, wherein the removing the oxide film on the surface of the amorphous silicon layer by performing the surface cleaning comprises
   spraying a hydrogen fluoride solution onto the surface of the amorphous silicon layer.

3. The method of claim 2, wherein the hydrogen fluoride solution comprises about 0.5 vol % of hydrogen fluoride.

4. The method of claim 2, wherein the removing the oxide film on the surface of the amorphous silicon layer by performing the surface cleaning further comprises
   performing a first rinse cleaning including supplying hydrogen water to the surface of the amorphous silicon layer in a free fall manner.

5. The method of claim 4, wherein the removing the oxide film on the surface of the amorphous silicon layer by performing the surface cleaning further comprises
   performing a second rinse cleaning including supplying hydrogen water to the surface of the amorphous silicon layer in a free fall manner while applying vibration to the hydrogen water with megasonic waves.

6. The method of claim 1, wherein the forming the active layer comprises:
   radiating a laser beam onto the amorphous silicon layer arranged over the substrate, wherein the laser beam has long sides and short sides in a first direction and a second direction perpendicular to each other, respectively; and
   moving the substrate by a predetermined pitch in the second direction parallel to the short sides.

7. The method of claim 6,
   wherein the laser beam is repeatedly turned on and off whenever the substrate is moved by the predetermined pitch,
   wherein the predetermined pitch is set to allow the laser beam to be turned on at least 7 times in a unit region of the amorphous silicon layer.

8. The method of claim 1, further comprising:
   providing a buffer layer between the substrate and the amorphous silicon layer,
   wherein a thickness of the amorphous silicon layer is in a range of about 370 Å to about 430 Å, and
   wherein the buffer layer comprises SiOx in a thickness of about 4000 Å to about 5000 Å.

9. A method of manufacturing a display apparatus, the method comprising:
   providing a thin film transistor over a substrate, and providing an organic light-emitting device connected to the thin film transistor,
   wherein the providing the thin film transistor comprises:
      providing an amorphous silicon layer over the substrate;
      removing an oxide film on a surface of the amorphous silicon layer by performing a surface cleaning without using an oxidant solution; and
      forming an active layer by performing a heat treatment on the amorphous silicon layer, wherein the amorphous silicon layer is changed into crystalline silicon by the heat treatment.

10. The method of claim 9 wherein the removing the oxide film on the surface of the amorphous silicon layer by performing the surface cleaning comprises
   spraying a hydrogen fluoride solution onto the surface of the amorphous silicon layer.

11. The method of claim 10,
   wherein the hydrogen fluoride solution comprises about 0.5 vol % of hydrogen fluoride.

12. The method of claim 10, wherein the removing the oxide film on the surface of the amorphous silicon layer by performing the surface cleaning further comprises
   performing a first rinse cleaning including supplying hydrogen water to the surface of the amorphous silicon layer in a free fall manner.

13. The method of claim 12, wherein the removing the oxide film on the surface of the amorphous silicon layer by performing the surface cleaning further comprises
   performing a second rinse cleaning including supplying hydrogen water to the surface of the amorphous silicon layer in a free fall manner while applying vibration to the hydrogen water with megasonic waves.

14. The method of claim 9, wherein the forming the active layer comprises:
   radiating a laser beam onto the amorphous silicon layer arranged over the substrate, wherein the laser beam has long sides and short sides in a first direction and a second direction perpendicular to each other, respectively; and
moving the substrate by a predetermined pitch in the second direction parallel to the short sides.

15. The method of claim 14,
   wherein the laser beam is repeatedly turned on and off whenever the substrate is moved by the predetermined pitch, and
   wherein the predetermined pitch is set to allow the laser beam to be turned on at least 7 times in a unit region of the amorphous silicon layer.

16. The method of claim 9, further comprising:
providing a buffer layer between the substrate and the amorphous silicon layer,
   wherein a thickness of the amorphous silicon layer is in a range of about 370 Å to about 430 Å, and
   wherein the buffer layer comprises SiOx in a thickness of about 4000 Å to about 5000 Å.

* * * * *